(12) United States Patent
Niaz (10) Patent No.: US 9,341,099 B2
(45) Date of Patent: May 17, 2016

(54) EMISSIONS CLEANING MODULE

(71) Applicant: Perkins Engines Company Limited, Cambridgeshire (GB)

(72) Inventor: Naseer A. Niaz, Cambridgeshire (GB)

(73) Assignee: Perkins Engines Company Limited, Peterborough (GB)

( * ) Notice: Subject to any disclaimer, the term of this patent is extended or adjusted under 35 U.S.C. 154(b) by 0 days.

(21) Appl. No.: 14/391,136

(22) PCT Filed: Dec. 7, 2012

(86) PCT No.: PCT/GB2012/053064
§ 371 (c)(1),
(2) Date: Oct. 7, 2014

(87) PCT Pub. No.: WO2013/160636
PCT Pub. Date: Oct. 31, 2013

(65) Prior Publication Data
US 2015/0071838 A1    Mar. 12, 2015

(30) Foreign Application Priority Data

Apr. 24, 2012   (GB) .................................. 1207201.3

(51) Int. Cl.
*F01N 3/00*         (2006.01)
*F01N 3/20*         (2006.01)
(Continued)

(52) U.S. Cl.
CPC .............. *F01N 3/20* (2013.01); *B01D 46/0002* (2013.01); *B01D 46/0057* (2013.01); *B01D 53/864* (2013.01); *B01D 53/92* (2013.01); *B60R 13/0876* (2013.01); *F01N 3/02* (2013.01); *F01N 3/021* (2013.01); *F01N 3/0233* (2013.01); *F01N 3/035* (2013.01); *F01N 3/08* (2013.01); *F01N 3/28* (2013.01); *F01N 3/2892* (2013.01); *F01N 9/00* (2013.01); *F01N 13/00* (2013.01);
(Continued)

(58) Field of Classification Search
USPC ............ 60/274, 286, 295, 297, 300, 301, 303
See application file for complete search history.

(56) References Cited

U.S. PATENT DOCUMENTS 5,826,428 A * 10/1998 Blaschke ........................ 60/303
6,620,391 B2 * 9/2003 Muller et al. .................. 423/210
(Continued)

FOREIGN PATENT DOCUMENTS

EP        1712755 A1    10/2006
EP        1939417 A1     7/2008
(Continued)

OTHER PUBLICATIONS

European Patent Office, International Search Report in International Patent Application No. PCT/GB2012/053064, Aug. 5, 2012, 3 pp.

*Primary Examiner* — Binh Q Tran (57) ABSTRACT

An emissions cleaning module includes a flow conduit having an upstream end fluidly connected to a source of exhaust fluid and a downstream end fluidly connected to a mixer module. An injector module has an outlet orientated to inject injection fluid into the flow conduit upstream the mixer module. A low pressure cavity downstream the injector module outlet is fluidly connected to the flow conduit or the mixer module by an open mouth orientated such that a flow of exhaust fluid along the flow conduit flows over the open mouth creating a pressure reduction within the low pressure cavity.

16 Claims, 5 Drawing Sheets

(51) Int. Cl.
| | | |
|---|---|---|
| *F01N 3/28* | (2006.01) | |
| *F01N 13/08* | (2010.01) | |
| *F01N 13/00* | (2010.01) | |
| *F01N 13/14* | (2010.01) | |
| *F01N 13/18* | (2010.01) | |
| *F01N 3/021* | (2006.01) | |
| *F01N 3/02* | (2006.01) | |
| *F01N 3/023* | (2006.01) | |
| *G01M 15/10* | (2006.01) | |
| *B60R 13/08* | (2006.01) | |
| *B01D 46/00* | (2006.01) | |
| *F01N 3/08* | (2006.01) | |
| *B01D 53/86* | (2006.01) | |
| *F01N 3/035* | (2006.01) | |
| *B01D 53/92* | (2006.01) | |
| *F01N 9/00* | (2006.01) | |
| *H05K 5/02* | (2006.01) | |
| *H05K 7/20* | (2006.01) | |

(52) U.S. Cl.
CPC ............ *F01N13/008* (2013.01); *F01N 13/08* (2013.01); *F01N 13/14* (2013.01); *F01N 13/143* (2013.01); *F01N 13/18* (2013.01); *F01N 13/1805* (2013.01); *G01M 15/102* (2013.01); *H05K 5/02* (2013.01); *H05K 7/20436* (2013.01); *F01N 2240/20* (2013.01); *F01N 2260/022* (2013.01); *F01N 2260/20* (2013.01); *F01N 2450/22* (2013.01); *F01N 2490/06* (2013.01); *Y10T 29/49345* (2015.01)

(56) References Cited

U.S. PATENT DOCUMENTS

| | | | |
|---|---|---|---|
| 8,276,372 B2 * | 10/2012 | Kowada | 60/295 |
| 8,596,044 B2 * | 12/2013 | Werni et al. | 60/286 |
| 8,695,330 B2 * | 4/2014 | Davidson et al. | 60/303 |
| 8,959,900 B2 * | 2/2015 | Solbrig et al. | 60/295 |
| 2010/0257850 A1 | 10/2010 | Kowada et al. | |

FOREIGN PATENT DOCUMENTS

| | | |
|---|---|---|
| FR | 2920471 A1 | 3/2009 |
| FR | 2924750 A1 | 6/2009 |
| JP | 2006-329019 A | 12/2006 |
| JP | 2008-051011 A | 3/2008 |
| JP | 2011157825 | 8/2011 |

* cited by examiner

EMISSIONS CLEANING MODULE

TECHNICAL FIELD

The disclosure relates to an apparatus for cleaning fluids emitted during the operation of combustion engines.

BACKGROUND

Engines, for example IC engines burning gasoline, diesel or biofuel, output various harmful substances which must be treated to meet current and future emissions legislation. Most commonly those substances comprise hydrocarbons (HC), carbon monoxides (CO), mono-nitrogen oxides ($NO_x$) and particulate matter, such as carbon (C), a constituent of soot. Some of those substances may be reduced by careful control of the operating conditions of the engine, but usually it is necessary to provide an emissions cleaning module downstream of the engine to treat at least some of those substances entrained in the exhaust gas. Various apparatus for reducing and/or eliminating constituents in emissions are known. For example, it is known to provide an oxidation device, such as a diesel oxidation catalyst, to reduce or to eliminate hydrocarbons (HC) and/or carbon monoxide (CO). Oxidation devices generally include a catalyst to convert those substances into carbon dioxide and water, which are significantly less harmful. As a further example, emissions cleaning modules may include a particulate filter to restrict the particulates present in the exhaust gas from being output to atmosphere.

By use of an emissions cleaning module, engine emissions can be cleaned, meaning that a proportion of the harmful substances which would otherwise be released to atmosphere are instead converted to carbon dioxide ($CO_2$), nitrogen ($N_2$) and water ($H_2O$).

In addition, it is known to reduce or eliminate mono-nitrogen oxides ($NO_x$) in diesel combustion emissions by conversion to diatomic nitrogen ($N_2$) and water ($H_2O$) by catalytic reaction with chemicals such as ammonia ($NH_3$) entrained in the exhaust gas. Generally ammonia is not present in exhaust gas and must therefore be introduced upstream of a catalyst, typically by injecting a urea solution into the exhaust gas which decomposes into ammonia at sufficiently high temperatures.

By these methods, engine emissions can be cleaned, meaning that a proportion of the harmful substances which would otherwise be released to atmosphere are instead converted to carbon dioxide ($CO_2$), nitrogen ($N_2$) and water ($H_2O$).

Emissions cleaning modules may also comprise an injector module for injecting a fluid, such as urea, into the engine emissions flow. It is also know to include a mixer module to aid mixer of the injected urea with the engine emissions flow. For example, US2010/0257850 describes an emission cleaning module having a mixer pipe into which urea is injected. It is desirable to fully mix the injected urea into the engine emissions flow. Otherwise deposits of urea can build-up within the emissions cleaning module. These deposits can degrade performance of the emissions cleaning module and may potentially interfere with, or block, further injection fluid from proper mixing.

Against this background there is provided an emissions cleaning module comprising an improved arrangement for injecting an injection fluid into a flow of exhaust fluid.

SUMMARY OF THE DISCLOSURE

The present disclosure provides an emissions cleaning module comprising:

a flow conduit having an upstream end fluidly connected to a source of exhaust fluid and a downstream end fluidly connected to a mixer module;

an injector module having an outlet orientated to inject an injection fluid into the flow conduit upstream of the mixer module; and a low pressure cavity located downstream of the injector module outlet; wherein the low pressure cavity is fluidly connected to the flow conduit or mixer module by an open mouth, the open mouth being orientated such that, in use, a flow of exhaust fluid along the flow conduit flows over the open mouth thereby creating a pressure reduction within the low pressure cavity.

The present disclosure also provides a method of injecting an injection fluid into a flow of exhaust fluid, comprising the steps of:

setting up a flow of exhaust fluid, through a conduit, from an upstream source to a downstream mixer module;

injecting into the flow of exhaust fluid an injection fluid at an injection location; and creating a low pressure region in the flow of exhaust fluid downstream of the injection location;

wherein the low pressure region is created by flowing the flow of exhaust fluid across an open mouth of a low pressure cavity fluidly connected to the flow conduit or mixer module.

BRIEF DESCRIPTION OF THE DRAWINGS

The present disclosure will now be described, by way of example only, with reference to the accompanying drawings in which.

DETAILED DESCRIPTION

Figure 1:
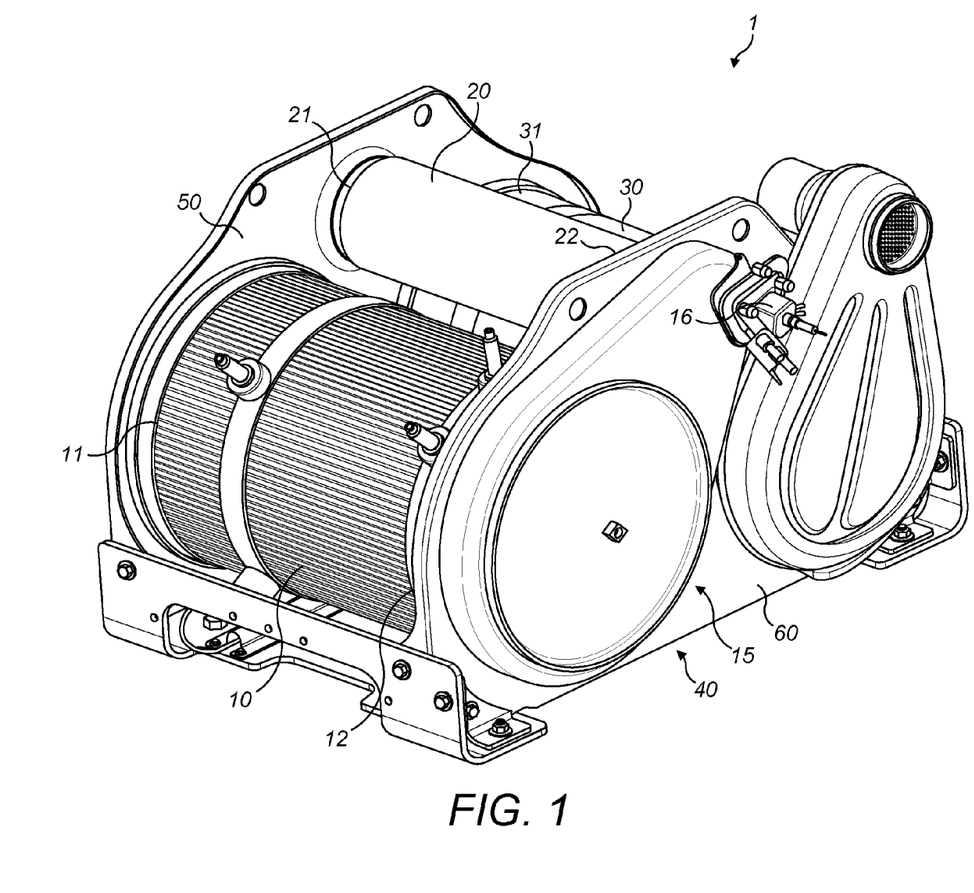
FIG. 1 shows an emissions cleaning module in accordance with the present disclosure.

An emissions cleaning module 1 is illustrated in FIG. 1.

The emissions cleaning module 1 may comprise a first conduit 10 and a second conduit 20. A third conduit 30 and a support structure 40 may also be present. The support structure 40 comprises a first support member 50 and a second support member 60.

Each support member 50, 60 may be generally planar and may be of rigid material, for example metal.

The first, second and third conduits 10, 20, 30 may be elongate, having an axis of elongation, and may have substantially constant cross-section along the axis of elongation. The first, second and third conduits 10, 20, 30 may be substantially cylindrical.

The first conduit 10 comprises a first end 11 providing an inlet to the conduit and a second end 12 providing an outlet to the conduit. The second conduit 20 comprises a first end 21 providing an outlet to the conduit and a second end 22 providing an inlet to the conduit. The third conduit 30 may comprise a first end 31 providing an inlet to the conduit and a second end providing an outlet to the conduit.

The conduits 10, 20, 30 may extend between the support members 50, 60. The conduits 10, 20, 30 may be generally substantially parallel. The first ends 11, 21, 31 of the first, second and third conduits 10, 20, 30 may be received in and may be shaped to correspond with first, second and third openings 51, 52, 53, respectively, of the first support member 50. The second ends 12, 22 of the first, second and third conduits 10, 20, 30 may be received in and may be shaped to correspond with first, second and third openings 61, 62, 63, respectively, of the second support member 60. By this arrangement, lateral movement of the conduits may be restricted.

Figure 2:
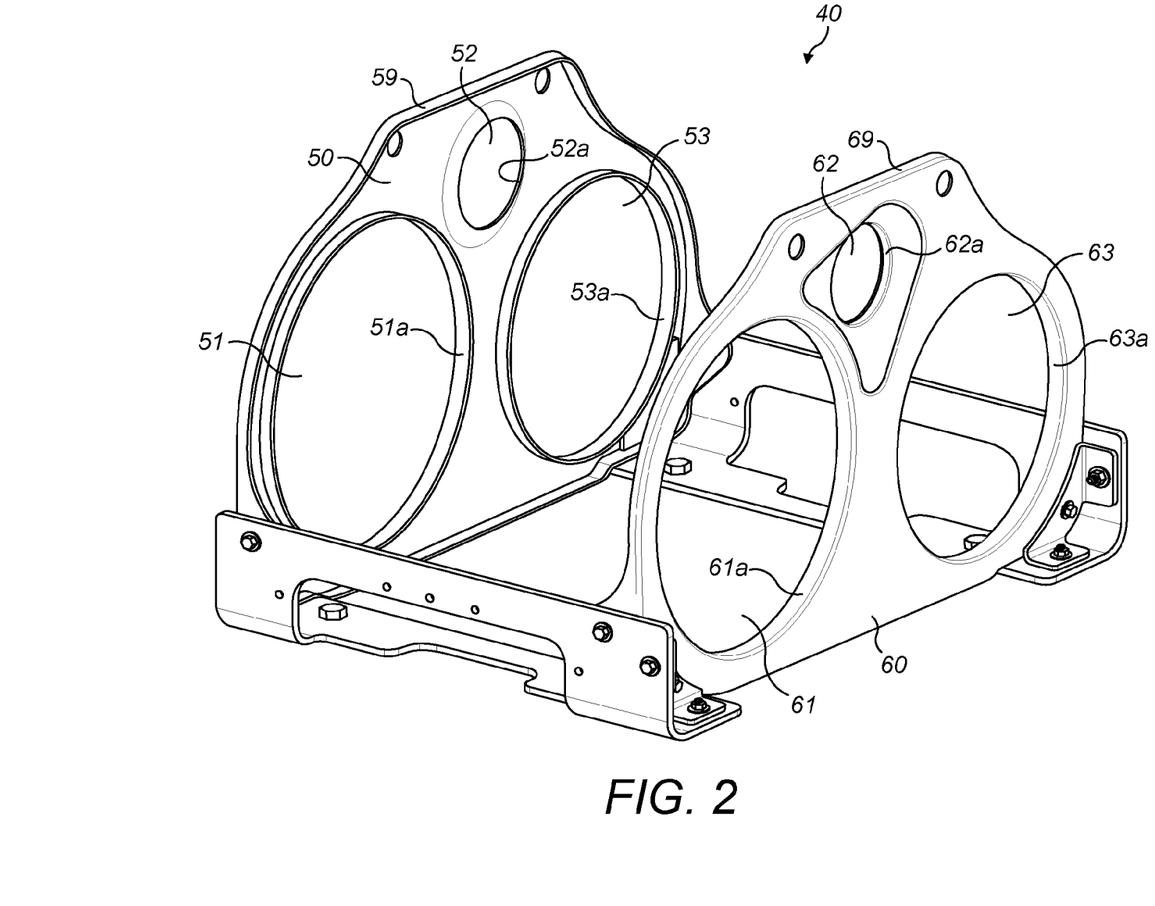
FIG. 2 shows a support frame of the emissions cleaning module of FIG. 1.

As shown in FIG. 2, each opening 51, 52, 53, 61, 62, 63 may comprise a flange 51a, 52a, 53a, 61a, 62a, 63a extending around a perimeter of the opening. Each support member 50, 60 may further comprise an inwardly turned lip 59, 69 extending at least part way around a periphery of the support member 50, 60.

The conduits 10, 20, 30 may all be of substantially similar length. The first conduit 10 may have a first diameter, the second conduit 20 may have a second diameter and the third conduit 30 may have a third diameter. The second diameter may be smaller than the first and third diameters.

The first and second ends 11, 21, 31, 12, 22 of the conduits 10, 20, 30 may be welded, adhered or otherwise secured to portions of the support members 50, 60 defining or surrounding the openings. Alternatively, first and second ends 11, 21, 31, 12, 22 of the conduits 10, 20, 30 may abut the inner sides of the support members 50, 60 so as to overlie respective openings in the support members 50, 60.

The first, second and third conduits 10, 20, 30 and the first and second support members 50, 60 may be interconnected in a manner which restricts relative translational movement of those components. Instead or in addition, the first, second and third conduits 10, 20, 30 and the first and second support members 50, 60 may be interconnected in a manner which restricts rotational movement of one component with respect to another.

The first conduit 10 is fluidly coupled to the second conduit 20 via a first end coupling 15 which fluidly connects the outlet of the first conduit 10 to the inlet of the second conduit 20. The first end coupling 15 may comprise an injector module 16. The second conduit 20 may be coupled to the third conduit 30 via a second end coupling for fluidly connecting the outlet of the second conduit 20 to the inlet of the third conduit 30. Each of the first and second end couplings may define, in combination with its respective support member, a fluid flow path through which exhaust gas may pass between adjacent conduits.

Within the fluid flow path of the emissions cleaning module there may be located a diesel oxidation catalyst (DOC) module, a diesel particulate filter (DPF) module, the injector module 16, a mixer module 75, a selective catalyst reduction (SCR) module and an ammonia oxidation catalyst (AMOX) module.

The DOC module may be located in a first portion of the first conduit 10 towards the first, inlet, end 11 of the first conduit 10. The DPF module may be located in a second portion of the first conduit 10 towards the second, outlet, end 12 of the first conduit 10. The first end coupling 15 may provide a fluid flow path from the second end 12 of the first conduit 10 to the second end 22 of the second conduit 20. The first end coupling 15 may comprise the injector module 16.

Figure 3:
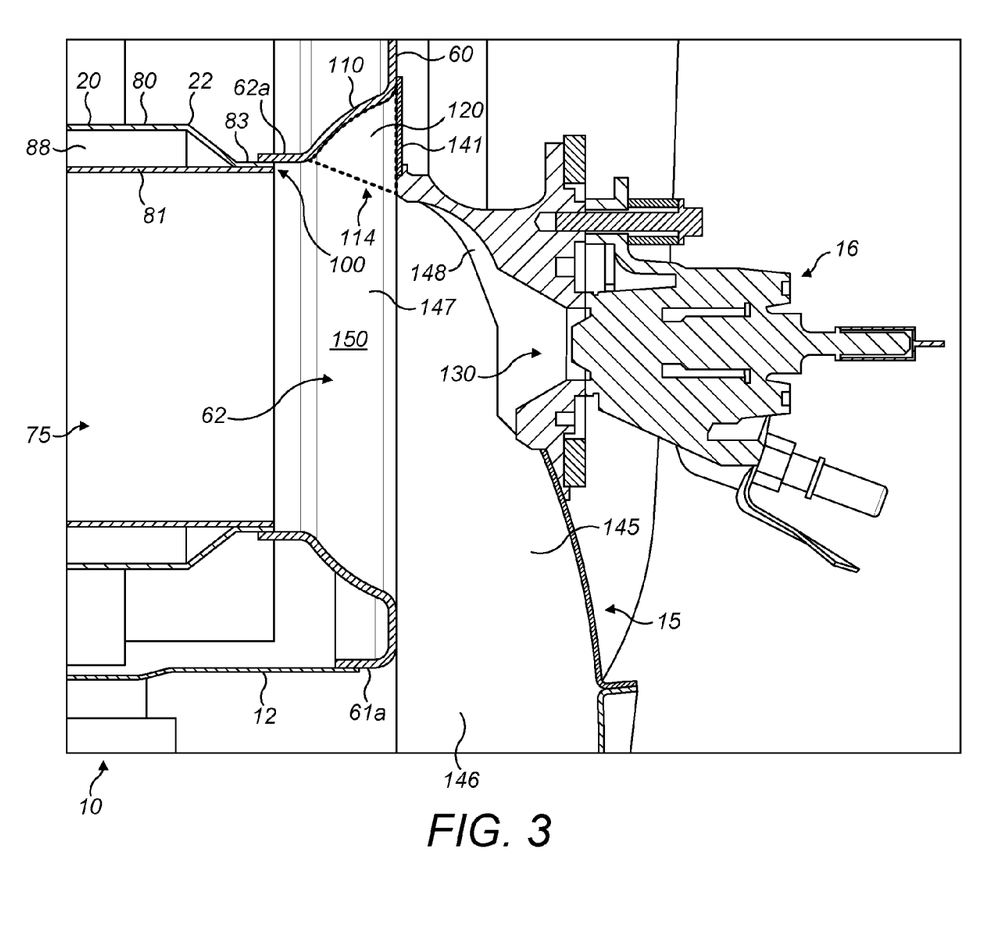
FIG. 3 shows a cross-section through a part of the emissions cleaning module of FIG. 1.

The mixer module 75 may be located in, or formed by, the second conduit 20. The mixer module 75 may comprise an outer body 80 and an inner body 81 located within the outer body 80. The outer body 80 may form the external skin of the second conduit 20. An air gap 88 may be provided between the inner body 81 and the outer body 80.

The outer body 80 may be elongate and extends between the first support 50 and the second support 60. The outer body 80 may be cylindrical and may have a constant diameter except at the ends thereof which may have a smaller diameter. A first end of the outer body 80 may be fixedly retained to the first support 50. The fixation may be by means of a weld between the first end and the flange 52a. The connection may be to an inner or outer face of the flange 52a. A second end 83 of the outer body 80 may be fixedly retained to the second support 60. The fixation may be by means of a weld between the second end 83 and the flange 62a. The connection may be to an inner face of the flange 62a, as shown in FIG. 3. This attachment may create a small annular crevice 100 where an end rim of the second end 83 lies adjacent the flange 62a.

The mixer module 75 may be configured to mix a fluid injected by the injector module 16 with a fluid arriving from the first conduit 10. The mixer module 75 may comprise multiple features, such as interspersed fins, which may give rise to an even blend of the injected fluid with the fluid from the first conduit 10.

The injector module 16 may comprises an injector having an injection outlet 130. The injection outlet 130 may be orientated to direct injected fluid along a longitudinal axis of the mixer module 75. The injector module 16 may be associated with or attachable to a pump electronic tank unit (PETU). The pump electronic tank unit may comprise a tank for providing a reservoir for fluid to be injected by the injector. Such fluids may include urea or ammonia. The PETU may further comprise a controller configured to control a volume of fluid to be injected from the tank by the injector. The controller may have as inputs, for example, temperature information and quantity of $NO_x$ information which may be derived from sensors in the SCR module.

The first end coupling 15 may be in the form of a flow hood. The first end coupling 15, together with the first conduit 10 and the mixer module 75 may define a flow conduit for exhaust fluid. The first end coupling 15 may comprise a bend that reverses the direction of flow of the exhaust fluid from when it leaves the first conduit 10 to when it enters the mixer module 75. The first end coupling 15 may comprise a central section 145 in which the direction of fluid flow is substantially perpendicular to the direction of fluid flow in the first conduit 10. The first end coupling 15 may further comprise a first 90° bend 146 adjacent the first conduit 10 and a second 90° bend 147 adjacent the mixer module 75.

The injector module 16 may be mounted into an aperture in the first end coupling 15. The injector module 16 may be mounted on an outside 148 of the second 90° bend 147.

The opening 62 may define a bore 150 which fluidly connects the second 90° bend 147 of the first end coupling 15 to the mixer module 75.

Figure 4:
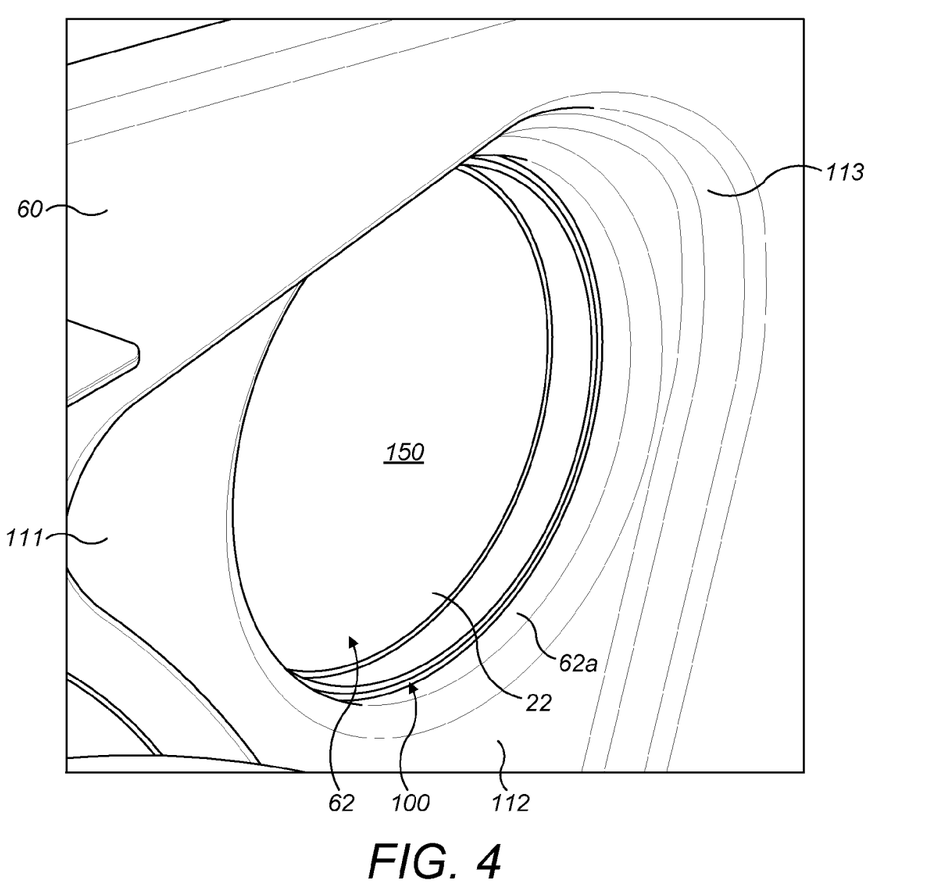
FIG. 4 shows a perspective view of a part of the emissions cleaning module of FIG. 1.

The first end coupling 15 may be connected to a first side of the second support 60 and the mixer module 75 may be connected to a second side of the second support 60. The flange 62a surrounding the second opening 62, as shown in FIG. 4, may be joined to a remainder of the second support 60 by a curved section 110. The curved section 110 may comprise three recesses 111, 112, 113 which may be arranged around the axis of the bore 150. The recess 113 may be on the outside 148 of the second 90° bend 147. The recess 113 may form a localised enlargement of the bore 150.

The recess 113 may define a low pressure cavity 120. The first end coupling 15 may comprise a flange 141 which may partly overlie the recess 113 to help define the low pressure cavity 120. Thus, the low pressure cavity 120 may be formed by the inter-engagement of the second support 60 and the first end coupling 15. The low pressure cavity 120 may be fluidly connected to the flow conduit for exhaust fluid by an open mouth 114. The low pressure cavity 120 is downstream of the injection outlet 130 and may be upstream of the mixer module 75 and the annular crevice 100.

The second end coupling may provide a fluid flow path from the first end 21 of the second conduit to the first end 31 of the third conduit 30.

The SCR module may be located in a first portion of the third conduit 30 towards the first end 31 of the third conduit 30. The SCR module may comprise a catalyst surface intended to catalyse a reaction to occur between the two fluids mixed in the mixer module and output by the diffuser. The AMOX module may both be located in a second portion of the third conduit 30 towards the second end of the third conduit 30. The AMOX module may comprise a catalyst which may catalyse a reaction of one or more of the products output from the SCR module.

In use, exhaust fluid may be supplied to the emissions cleaning module 1 via an inlet. Fluid may pass into the DOC module in the first portion of the first conduit 10. Prior to receipt at the inlet, the pressure of the fluid may be controlled by a back pressure valve.

The DOC module may comprise one or more catalysts, such as palladium or platinum. These materials serve as catalysts to cause oxidation of hydrocarbons ([HC]) and carbon monoxide (CO) present in the fluid flow in order to produce carbon dioxide ($CO_2$) and water ($H_2O$). The catalysts may be distributed in a manner so as to maximise the surface area of catalyst material in order to increase effectiveness of the catalyst in catalysing reactions.

Fluid may flow from the DOC module to the DPF module which comprises features which are intended to prevent onward passage of carbon (C) in the form of soot. Carbon particles in the fluid may thus trapped in the filter. The filter may be regenerated through known regeneration techniques. These techniques may involve controlling one or more of the temperature of the fluid, the pressure of the fluid and the proportion of unburnt fuel in the fluid.

Fluid may pass from the DOC into the first end coupling 15. The fluid flow may pass around the first 90° bend 146 into the central section 145, then into the second 90° bend 147. The flow passes the injection outlet 130 of the injector module 16. The injector module 16 may inject the injection fluid, for example urea or ammonia, into the flow. The direction of the injection of the injection fluid may be into the bore 150 of the second opening 62 and may be past the open mouth 114 of the low pressure cavity 120. The direction of injection may be along the axis of the mixer module 75.

The flow of the exhaust fluid will flow across the open mouth 114 of the low pressure cavity 120 reducing the fluid pressure within the low pressure cavity 120. As a consequence turbulence is created in the flow of exhaust fluid (now containing the injection fluid) at or in proximity to the open mouth 114. This turbulence may improve the mixing of the injection fluid with the flow of exhaust fluid. This may help to reduce the build-up of deposits in the annular crevice 100 derived from the injection fluid.

Figure 5A:
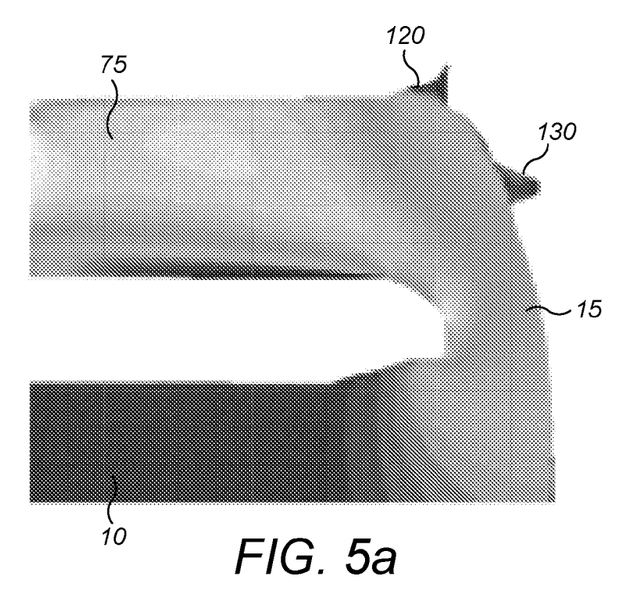
FIGS. 5a and 5b show comparative fluid pressures within a part of the emissions cleaning module of FIG. 1, with and without the provision of a low pressure cavity.
Figure 5B:
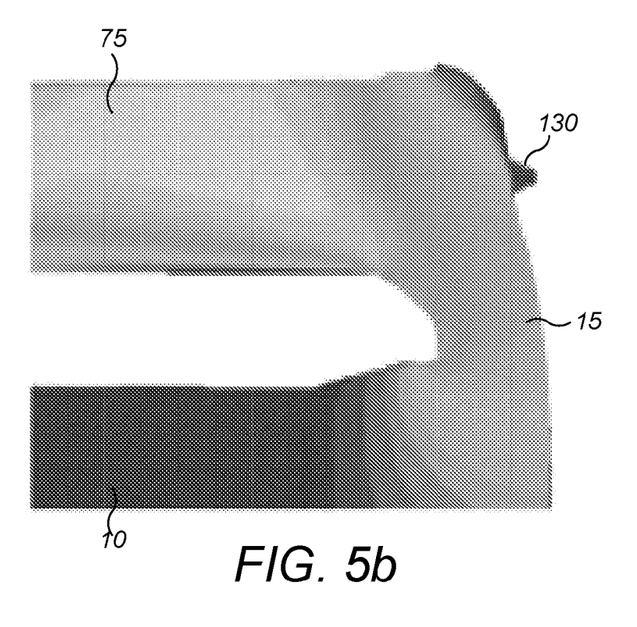

The effect of the presence of the low pressure cavity 120 may be seen by comparison of FIGS. 5a and 5b. FIG. 5a illustrates the pressure distribution within the flow with the low pressure cavity 120 present. FIG. 5b illustrates the pressure distribution within the flow without such a cavity. The presence of the low pressure cavity 120 creates a localised zone of relatively low pressure which may be immediately upstream of the annular crevice 100 which may result in increased turbulence and mixing.

The mixer module 75 may further comprise features for ensuring that the fluid originating from the first conduit 10 undergoes further mixing with the fluid originating from the injector 16 within the second conduit 20 itself.

After the mixer module 75, fluid may then pass via the second end coupling into the SCR module located in the first portion of the third conduit via the second end coupling. The SCR module may comprise one or more catalysts through which the mixture of exhaust gas and urea/ammonia may flow. As the mixture passes over the surfaces of the catalyst a may reaction occur which converts the ammonia and $NO_x$ to diatomic nitrogen ($N_2$) and water ($H_2O$).

Fluid may pass from the SCR module to the AMOX module located in the second portion of the third conduit 30. The AMOX module may comprise an oxidation catalyst which may cause residual ammonia present in the fluid exiting the SCR module to react to produce nitrogen ($N_2$) and water ($H_2O$).

Fluid may pass from the AMOX module to the emissions cleaning module outlet located at the second end of the third conduit 30.

INDUSTRIAL APPLICABILITY

The present disclosure provides an emissions cleaning module comprising an improved arrangement for injecting and mixing an injection fluid into the flow of exhaust fluid. In particular, improved turbulence generation between the injector outlet and the mixer module helps to alleviate the problem of build-up of deposits of the injected fluid.

The invention claimed is:

1. An emissions cleaning module comprising:
   a flow conduit having an upstream end fluidly connected to a source of exhaust fluid, a bend, and a downstream end fluidly connected to a mixer module;
   an injector module having an outlet orientated to inject an injection fluid into the flow conduit upstream of the mixer module, the injector module outlet being located on the outer side of the bend; and
   a low pressure cavity fluidly connected to the flow conduit or mixer module by an open mouth located on an outer side of the bend downstream of the injector module outlet, the open mouth being orientated such that, in use, a flow of exhaust fluid along the flow conduit flows over the open mouth thereby creating a pressure reduction within the low pressure cavity.

2. An emissions cleaning module as claimed in claim 1 wherein the low pressure cavity is located between the injector module outlet and the mixer module.

3. An emissions cleaning module as claimed in claim 1 wherein the bend extends through at least 90°.

4. An emissions cleaning module as claimed in claim 1 wherein the upstream end fluidly connected to a source of exhaust fluid comprises a flow hood.

5. An emissions cleaning module as claimed in claim 4 further comprising a support which supports the flow hood and the mixer module.

6. An emissions cleaning module as claimed in claim 5 wherein the support fluidly connects the flow hood to the mixer module.

7. An emissions cleaning module as claimed in claim 5 wherein the flow hood is coupled to a first side of the support and the mixer module is coupled to a second side of the support.

8. An emissions cleaning module as claimed in claim 5 wherein the low pressure cavity is at least partly formed by the support.

9. An emissions cleaning module as claimed in claim 8 wherein the support comprises a bore through which may pass, in use, the flow of exhaust fluid, and the low pressure cavity is at least partly formed by a localised enlargement of the bore.

10. An emissions cleaning module as claimed in claim 8 wherein the low pressure cavity is formed by an inter-engagement of the support and the flow hood.

11. An emissions cleaning module as claimed in claim 10 wherein the low pressure cavity is formed by a recess in the support and a flange of the flow hood, wherein the flange at least partly overlies the recess.

12. An emissions cleaning module as claimed claim 4 wherein the injector module is mounted to the flow hood.

13. An emissions cleaning module as claimed in claim 12 wherein the injector module outlet is directed along a longitudinal axis of the mixer module.

14. An emissions cleaning module as claimed in claim 1 wherein the injector module is a urea or ammonia injector.

15. A method of injecting an injection fluid into a flow of exhaust fluid, comprising the steps of:
    setting up a flow of exhaust fluid, through a conduit, from an upstream source through a bend in the conduit to a downstream mixer module;
    injecting from an outer side of the bend into the flow of exhaust fluid an injection fluid at an injection location; and
    creating a low pressure region in the flow of exhaust fluid along the outer side of the bend downstream of the injection location;
    wherein the low pressure region is created on the outer side of the bend by flowing the flow of exhaust fluid across an open mouth of a low pressure cavity fluidly connected to the flow conduit or mixer module downstream the injection location.

16. A method as claimed in claim 15 wherein the low pressure cavity is located between the injection location and the mixer module.

* * * * *